United States Patent
Holzapfel et al.

(10) Patent No.: US 9,303,980 B2
(45) Date of Patent: Apr. 5, 2016

(54) SYSTEM FOR POSITIONING A TOOL RELATIVE TO A WORKPIECE

(71) Applicant: DR. JOHANNES HEIDENHAIN GMBH, Traunreut (DE)

(72) Inventors: Wolfgang Holzapfel, Obing (DE); Jörg Drescher, Samerberg (DE); Katie Dodds-Eden, Traunstein (DE); Bernhard Musch, Traunreut (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 0 days.

(21) Appl. No.: 14/508,553

(22) Filed: Oct. 7, 2014

(65) Prior Publication Data
US 2015/0098091 A1    Apr. 9, 2015

(30) Foreign Application Priority Data
Oct. 7, 2013 (DE) .......................... 10 2013 220 214

(51) Int. Cl.
*G01B 11/14*  (2006.01)
*G03F 7/20*  (2006.01)
*B23Q 3/18*  (2006.01)

(52) U.S. Cl.
CPC  *G01B 11/14* (2013.01); *B23Q 3/18* (2013.01); *G03F 7/70775* (2013.01)

(58) Field of Classification Search
USPC .................................................. 356/625–640
See application file for complete search history.

(56) References Cited

U.S. PATENT DOCUMENTS

| | | |
|---|---|---|
| 6,249,626 B1 | 6/2001 | Bergmann |
| 7,483,120 B2 | 1/2009 | Luttikhuis et al. |
| 7,573,581 B2 | 8/2009 | Holzapfel |
| 7,710,578 B2 | 5/2010 | Sändig et al. |
| 2008/0079920 A1 | 4/2008 | Hommen et al. |

(Continued)

FOREIGN PATENT DOCUMENTS

| | | |
|---|---|---|
| DE | 102014218623 | 4/2015 |
| EP | 1 533 594 | 5/2005 |

(Continued)

OTHER PUBLICATIONS

European Search Report issued in European Patent Application No. 14 17 9262, dated Feb. 17, 2015.

(Continued)

*Primary Examiner* — Tri T Ton
(74) *Attorney, Agent, or Firm* — Kenyon & Kenyon LLP

(57) ABSTRACT

A system for positioning a tool relative to a workpiece includes a movable table for accommodating a workpiece, and executing movements in two main moving directions during processing of the workpiece, one or more planar measuring standards provided in stationary fashion about the tool and extend in the plane of the main moving directions, and scanning heads, mounted in at least three corners of the table, for detecting the position of the table relative to the measuring standards. The position of the table is determinable by the scanning heads in six degrees of freedom. In at least one of the corners, one or more scanning heads having a total of at least three measuring axes is/are provided for 3-D position detection in three independent spatial directions. Sensitivity vectors of the measuring axes for the 3-D position detection are neither parallel to the X-Z plane nor parallel to the Y-Z plane.

10 Claims, 3 Drawing Sheets

(56) References Cited

U.S. PATENT DOCUMENTS

| | | |
|---|---|---|
| 2009/0195792 A1 | 8/2009 | Hermann et al. |
| 2011/0141451 A1 | 6/2011 | Yamaguchi et al. |
| 2012/0032067 A1 | 2/2012 | Goodwin et al. |
| 2013/0335746 A1 | 12/2013 | Huber et al. |
| 2015/0098090 A1 | 4/2015 | Holzapfel et al. |

FOREIGN PATENT DOCUMENTS

| | | |
|---|---|---|
| EP | 1 762 828 | 3/2007 |
| EP | 1 826 615 | 8/2007 |
| EP | 1 901 041 | 3/2008 |

OTHER PUBLICATIONS

Gao, W. et al., "A Three-axis Displacement Sensor with Nanometric Resolution", Annals of the CIRP, vol. 56, Jan. 2007.

European Search Report, dated May 20, 2015, issued in corresponding European Patent Application No. 14185047.9.

SYSTEM FOR POSITIONING A TOOL RELATIVE TO A WORKPIECE

CROSS-REFERENCE TO RELATED APPLICATIONS

The present application claims priority to Application No. 10 2013 220 214.8, filed in the Federal Republic of Germany on Oct. 7, 2013, which is expressly incorporated herein in its entirety by reference thereto.

FIELD OF THE INVENTION

The present invention relates to a system for positioning a tool relative to a workpiece, which may permit highly accurate determination of the relative position of the two objects movable relative to each other, and therefore very precise positioning.

BACKGROUND INFORMATION

Primarily in the field of manufacturing integrated circuits having pattern sizes far less than one micrometer, it is necessary to position the semiconductor substrates (also referred to as wafers or workpieces) very precisely under a tool such as the lens of a light-exposing apparatus, for example, with whose aid the finest patterns are then transferred into a photosensitive resist applied beforehand on the wafer.

To that end, it is described in U.S. Pat. No. 7,483,120, for example, to place the wafer on a movable table that is able to be positioned relative to the lens of the light-exposing apparatus. Four grating plates are provided as measuring standards about the lens in an X-Y plane, and are joined as rigidly as possible to the lens. The optical axis of the lens is perpendicular to the plane of the grating plates and defines a Z-direction. The table and wafer are arranged parallel to the grating plates or measuring standards. Disposed in the corners of the table are scanning heads of position-measuring devices, which scan the grating plates with the aid of light. When the table moves relative to the grating plates, the scanning heads form periodic signals from which, by counting the periods and by fine subdivision of individual periods (interpolation), extremely precise values are obtained for the change in position. If an absolute position is ascertained one time, e.g., by detecting reference marks, the determination of the change in position is synonymous with the determination of an absolute position, since the absolute position may be calculated from the change in position, starting from the reference position.

In the present context, "corners of the table" refers to edge regions of the table different from each other and set apart as far as possible from each other for a given table size. The placement of scanning heads in such corners is expedient for various reasons. Scanning heads can only be placed outside of the area occupied by the workpiece (disposed centrally on the table). In addition, as great a spacing of the scanning heads as possible among one another permits a more precise calculation of rotations from the linear shifts measured in the corners. Furthermore, individual corners or edge regions of the table may travel into the area of the tool, so that a scanning head located there is no longer able to scan a grating plate. In order to constantly determine position with extreme accuracy, it is wise to ensure that at all times, scanning heads are able to scan from areas of the table as far away from each other as possible. For this, it may be advantageous to combine the scanning heads in several corner areas, from which never more than one is able to move into the area of the tool.

Scanning heads for various measuring directions and arranged close together in one such corner reduce the size needed for the scanning plates. Ideally, the measurements may also be integrated in a single scanning head, for which examples are described below.

In the present context, two scanning heads for different measuring directions are located in the same corner of the table when their spacing is small in comparison to the expanse of the table. If two scanning heads have a spacing which is comparable to the dimensions of the table, then they are located in different corners or edge regions. At any rate, two scanning heads are located in different corners of the table when their spacing is greater than one tenth of the expanse of the table. For round tables, their diameter may be considered as an expanse, for rectangular or square tables, their diagonal may be considered as an expanse.

To position the table in the X-Y plane, its degrees of freedom must be determined in this plane. They are the linear shifts in the X-direction and Y-direction, as well as rotation rZ about the Z-axis, which together are also referred to as in-plane degrees of freedom, because all three degrees of freedom are located in the X-Y plane. To determine these three degrees of freedom X, Y, rZ, it is sufficient, for example, to measure the shift in X in two corners of the table, and in a further corner, the shift in Y. Rotation rZ may then easily be calculated. However, since during the shift of the table in the course of the exposure of the wafer, an individual corner may move into regions close to the lens in which no scanning plate is able to be scanned any longer, each of the corners of the table should have a scanning head. In U.S. Pat. No. 7,483,120, it is also described that it is advantageous in at least one of the corners to measure not only the shift in the X-direction, but also the shift in the Y-direction. Redundant measurements may be utilized to increase the measuring accuracy by averaging, or perhaps, for example, to take thermal expansions or vibrations of the table into account.

U.S. Pat. No. 7,483,120 further mentions that in the corners, in each case the distance to the grating plates may also be measured, e.g., a position measurement of the table corners in the Z-direction. With these measurements, the remaining three degrees of freedom of the table may also be determined, e.g., the linear shift in the Z-direction and rotations rX and rY about the X-axis and Y-axis, respectively. Thus, in addition, at all times, measurements in all three spatial directions are available in one corner area as close as possible to the place of action of the tool (the Tool Center Point). Due to such a 3-D position detection in one corner, accuracy of the positioning of the processing tool relative to the workpiece increases.

An optical position-measuring device suitable for such practical applications is described in European Published Patent Application No. 1 762 828. It includes a measuring standard (one of the grating plates), as well as a scanning head for scanning the measuring standard, the scanning head being situated in the corner of the table.

The scanning head permits simultaneous determination of position along a lateral shift direction (for example, an X-direction) and along a vertical shift direction (Z) of the table. The scanning head thus has two measuring axes. In order to determine position in the lateral and vertical shift direction, a first and a second scanning beam path are formed (one scanning beam path for each measuring axis), in which in each case from two non-mirror-symmetric, interfering partial beams of rays, a group of phase-shifted signals is able to be generated on the output side, which interfere with each other and produce periodic signals in a photodetector.

In highly precise position-measuring devices of the type discussed above, it is necessary to subject the periodic signals generated in the scanning head to a compensation with regard to their amplitude, their offset, and their phase relation, since only then is a very fine determination of position possible within one signal period. Since this compensation proceeds continuously during measuring operation, it is also called online compensation.

In the position-measuring device described in European Published Patent Application No. 1 762 828, care is therefore taken that even in the case of a pure shift in the lateral shift direction, periodic signals are formed in all photodetectors, even though there is no movement in the vertical shift direction.

In European Published Patent Application No. 1 762 828, this is achieved in that the two sensitivity vectors of the measuring axes of the scanning head do not point exactly in the lateral and vertical direction, respectively, but rather are disposed at specific angles relative to these directions. The sensitivity vector of a measuring axis indicates the moving direction in which the position signal of the respective measuring axis increases the fastest per unit of length traveled. Thus, it describes a property of the measuring axis. By offsetting the two periodic signals acquired, the actual movement in the desired measuring directions (lateral and vertical) may be obtained.

SUMMARY

Example embodiments of the present invention provide a system for positioning a tool relative to a workpiece, by which the relative position is able to be determined more precisely and therefore adjusted.

According to example embodiments of the present invention, a system for positioning a tool relative to a workpiece includes a movable table for accommodating a workpiece, the table executing movements in two main moving directions during the processing of the workpiece, one or more planar measuring standards that are disposed in stationary manner about the tool and extend in the plane of the main moving directions, and scanning heads, mounted in at least three corners of the table, for determining the position of the table relative to the measuring standards, the position of the table being determinable by the scanning heads in six degrees of freedom. In at least one of the corners, one or more scanning heads having a total of at least three measuring axes is/are provided for 3-D position detection in three independent spatial directions. The sensitivity vectors of these at least three measuring axes for 3-D position detection are arranged neither parallel to the X-Z plane nor parallel to the Y-Z plane.

In this manner, all measuring axes supply periodic signals when the table is moved in a main moving direction (X, Y). The signals are therefore compensatable upon each movement of the table in the X-direction or Y-direction.

Thus, the acquisition of measured position values in three independent spatial directions is possible in one corner of the table. The accuracy of the measurement is not impaired by the failure of the online compensation in one of the measuring axes during the machine action.

DETAILED DESCRIPTION

Before exemplary embodiments of the optical position-measuring device are described below, the position-measuring device described in European Published Patent Application No. 1 762 828 and in U.S. Pat. No. 7,573,581, each of which is expressly incorporated herein in its entirety by reference thereto, is briefly explained. As mentioned above, it is suitable for detecting position changes along two shift directions. In the corresponding scanning head, two scanning beam paths are formed so as to be tilted or asymmetrical relative to each other. In this connection, the beam of rays delivered by a light source is supplied via a first optical fiber in the form of a single mode fiber to the scanning system, and after being coupled out of the optical fiber, is collimated via collimating optics. The collimated beam of rays thereupon arrives at a splitting grating, in which it is split into two scanning beam paths for two measuring axes. The two measuring axes are also referred to hereinafter as A-axis and B-axis of the position-measuring device. The position information actually of interest along lateral shift direction X and vertical shift direction Z is obtained from the summation and the subtraction of position signals A, B according to the following equations 1a and 1b:

$$X=(A+B)/2 \qquad \text{(equation 1a)}$$

$$Z=(A-B)/2*SPz/SPx \qquad \text{(equation 1b)}$$

In this context, SPz represents the signal period in the Z-direction, and SPx represents the signal period in the X-direction.

In these equations, it is illustrated that in response to a pure movement in the X-direction, both the A-axis and the B-axis of the position-measuring device supply periodic signals, from whose sum, the actual shift in X may be obtained, and from whose difference, the actual shift in Z may be obtained.

The beams of rays in the respective scanning beam paths arrive first of all at the measuring standard (grating plate) in the form of a reflection grating, are thereby split into partial beams of rays of $+/-1^{st}$ order of diffraction, and are diffracted back to the scanning system. There, each of the partial beams of rays is folded back by a diffractive roof prism in the direction of the measuring standard. The two partial beams of rays interfere in each case at the measuring standard, the superposed partial beams of rays are subsequently relayed to coupling-out optics that include a focusing lens and a field lens, and are thereupon coupled out into a second optical fiber which includes six multimode light-conducting fibers.

A sensitivity vector is explained in greater detail below.

Figure 1:
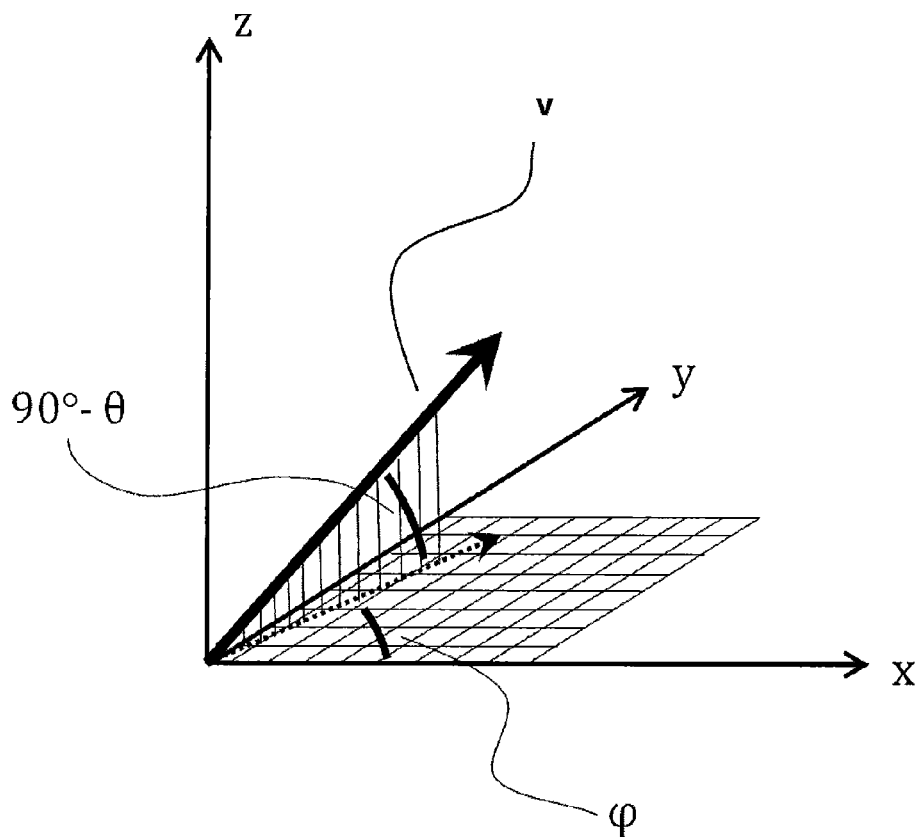
FIG. 1 illustrates the alignment of a sensitivity vector in a polar coordinate system.

A normalized sensitivity vector v may be assigned to each measuring axis. The sensitivity vector specifies the moving direction in which the position signal of the measuring axis increases the fastest per unit of length traveled. If the position of the measuring axis relative to the measuring standard changes by a displacement vector ΔS, then the change in the position signal of the measuring axis is given (in linear approximation) by the scalar product vΔS. The sensitivity vector v of a measuring axis may also be characterized by two angles θ, φ as follows, see also FIG. 1:

$$v = \begin{pmatrix} \sin(\theta)\cos(\varphi) \\ \sin(\theta)\sin(\varphi) \\ \cos(\theta) \end{pmatrix}$$

The polar angle θ is the angle with respect to the Z-axis and, per convention, is between 0° and 180°. For θ=90°, the sensitivity vector lies in the X-Y plane. In the perpendicular projection of v to the X-Y plane, the azimuth angle φ indicates the angle with respect to the X-axis.

Figure 2:
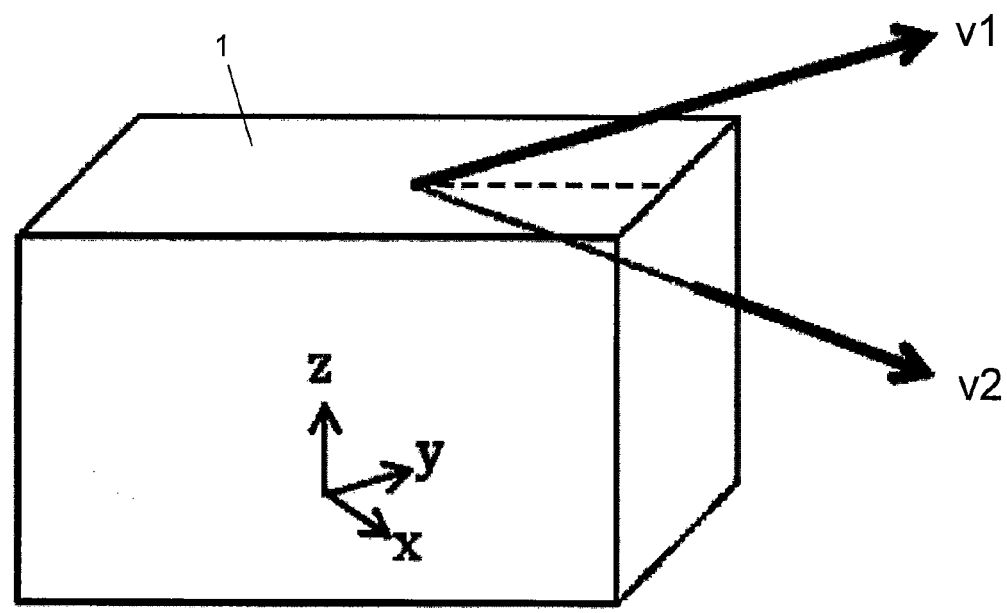
FIG. 2 schematically illustrates a conventional scanning head for two measuring directions.

FIG. 2 illustrates a conventional scanning head 1 for two measuring directions (e.g., having two measuring axes integrated into scanning head 1). According to the notation from FIG. 1, sensitivity vectors v1 and v2 corresponding to the two measuring axes A and B are given by θ=90°+Δθ, φ=45° and θ=90°−Δθ, φ=45°, where Δθ is an angle which lies between 0° and 90°. Because sensitivity vectors v1, v2 do not lie exactly in the X-Y plane, but rather in mirror symmetry with respect to this X-Y plane, by subtraction of the measured values, a position value may be ascertained in the Z-direction. On the other hand, by addition, a position value is obtained along an axis in the X-Y plane.

To determine position in one corner area in all three spatial directions (also referred to as 3-D position detection), it is suggested to provide three measuring axes with sensitivity vectors in the X-direction, Y-direction and Z-direction. However, this selection of the sensitivity vectors is unfavorable for 3-D position detection. Typically, a few unintentional disturbances such as fluctuations in the signal amplitudes are compensated for adaptively in the evaluation electronics of a measuring axis. This online compensation can only operate correctly when the measuring axis moves continuously in one direction over the graduated scale, and in so doing, covers several signal periods. If the machine is to move along one of its main moving directions, e.g., parallel to the X-axis, then the position values of the measuring axes in the Y-direction and Z-direction would be constant; no periodic signals would be formed. Since this would lead to a failure of the online compensation, measuring errors would increase in these directions.

The machines considered here have main moving directions which are denoted by X and Y according to the designations selected at the outset. During the exposure of a wafer, the table moves primarily only in the X-direction. Occasionally, a line jump with a movement in the Y-direction takes place, before the table is moved again in the X-direction.

In order to permit compensation of the detector signals during a movement in these main moving directions X, Y, no sensitivity vector of a measuring axis involved may be perpendicular to the moving direction of the machine. Consequently, for a machine whose main moving directions are located parallel to the X-axis and Y-axis, the sensitivity vectors must not be perpendicular to the X-axis or Y-axis.

Quite generally, it follows from this that the sensitivity vectors of 3-D position detection (which relates to one corner of the table) must not be located either in the X-Z plane or in the Y-Z plane. To be more precise, the angle between the sensitivity vector and the X-Z plane should not be less than approximately 1°. Similarly, the angle between the sensitivity vector and the Y-Z plane should amount to at least approximately 1°. Consequently, with reference to FIG. 1, among others, the angular ranges −1°<φ<1°, 89°<φ<91°, −89°<φ<−91°, 179°<φ<181°, as well as 0°≤θ<1° and 179°<θ≤180° are in each case ruled out. In particular, no sensitivity vector may be parallel to the Z-direction.

In order to always be able to carry out an online compensation for an extremely precise position measurement, measuring axes with at least three independent sensitivity vectors must be suitably aligned for the 3-D position detection. In response to a movement along the main moving directions of the machine, periodic signals must be obtained in all measuring axes. The general rules indicated above for this is explained in greater detail on the basis of exemplary embodiments.

In order to simplify the offsetting of the position signals, it is advantageous (but not absolutely necessary) to set to the angles (φ=φ₁, θ=90°+Δθ) and (φ=φ₁, θ=90°−Δθ) for the first two sensitivity vectors, with φ₁ and A being selected in the ranges 1°<φ₁<89°, 1°<Δθ<89°, so that the angle with respect to the X-Z plane and the angle with respect to the Y-Z plane amount to at least 1°. For φ₁, the choice φ₁=45° is again especially clear, but not absolutely necessary. By subtraction of the measured values from the first two measuring axes, except for a scaling factor, one immediately obtains the Z-position. By addition of the measured values, one measures in the X-Y plane in the φ₁-direction. A position-measuring device having two such sensitivity vectors is described, for example, in European Published Patent Application No. 1 762 828.

Figure 3:
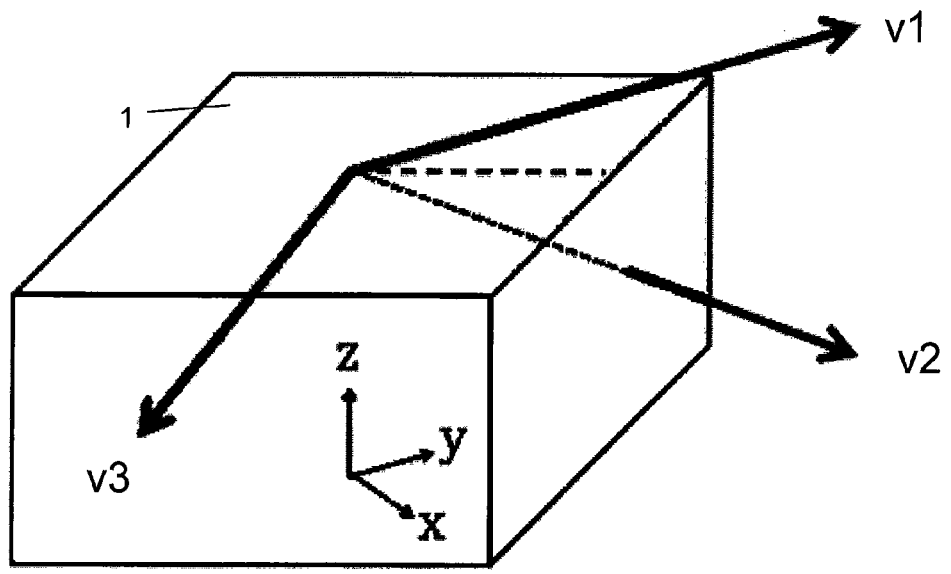
FIG. 3 schematically illustrates a scanning head for three measuring directions according to an example embodiment of the present invention.

Analogous to FIG. 2, FIG. 3 illustrates a scanning head 1 that is able to ascertain a total of three moving directions, which thus has three integrated measuring axes with three sensitivity vectors v1, v2, v3, and which generates periodic signals for each of these directions, which must be compensated. This scanning head is thus suitable for 3-D position detection. The main moving directions of the machine to be monitored are X and Y. In addition, the intention is to detect the position in the Z-direction. Scanning head 1 is located in the edge region, i.e., in a table corner according to the definition given above. In addition to the measuring axes with sensitivity vectors v1 and v2 already known from FIG. 2, scanning head 1 has a third measuring axis with a third sensitivity vector v3, for which θ=90°, φ=90°+φ₁ applies. A scanning head 1, which has three measuring axes integrated, is described in more detail in German Patent Application No. 10 2013 220 184.2 and U.S. patent application Ser. No. 14/508,097, each of which is expressly incorporated herein in its entirety by reference thereto.

Figure 4:
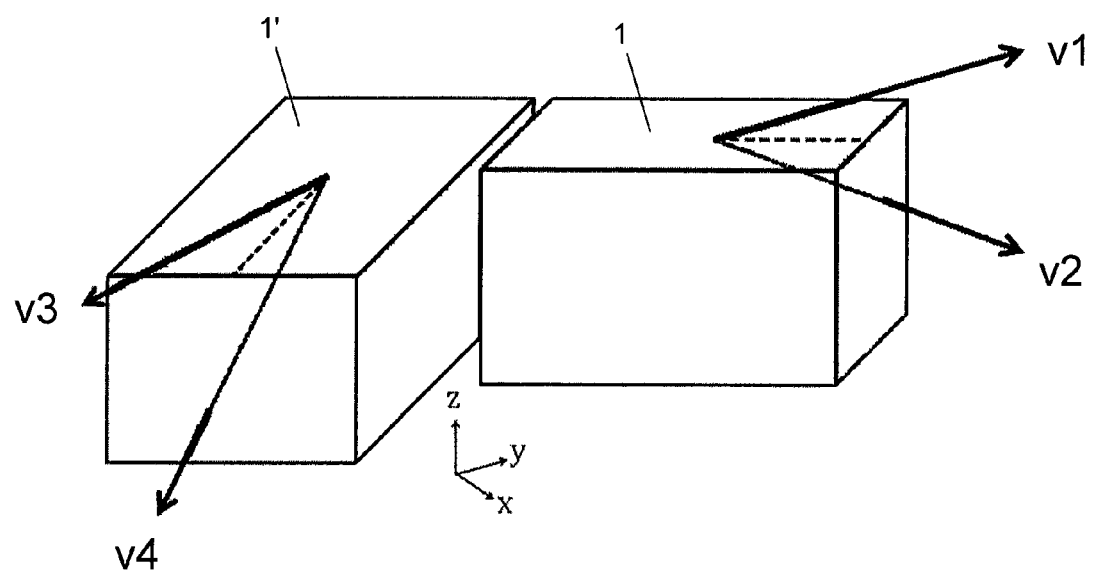
FIG. 4 schematically illustrates two scanning heads, disposed in one corner, for a total of four measuring directions according to an example embodiment of the present invention.

A further possibility for adhering to the boundary conditions given above for the alignment of the sensitivity vectors is to dispose two conventional scanning heads 1, 1' (corresponding to FIG. 2) close together in the same corner and rotated by 90 degrees about the Z-axis, as illustrated in FIG. 4, and to offset their total of four periodic signals against each other for the 3-D position detection. Care must be taken in this case as well, that all signals during the movement in main moving directions X and Y are compensatable. This is achieved by selecting the alignment of the two additional sensitivity vectors v3 and v4 accordingly (φ=90°+φ₁, θ=90°+Δ) and (φ=90°+φ₁, θ=90°−Δθ), in addition to the alignment of sensitivity vectors v1 and v2 already described with reference to FIG. 2. In this example, four measuring axes, of which two are integrated in each scanning head, are utilized for the 3-D position detection.

Figure 5:
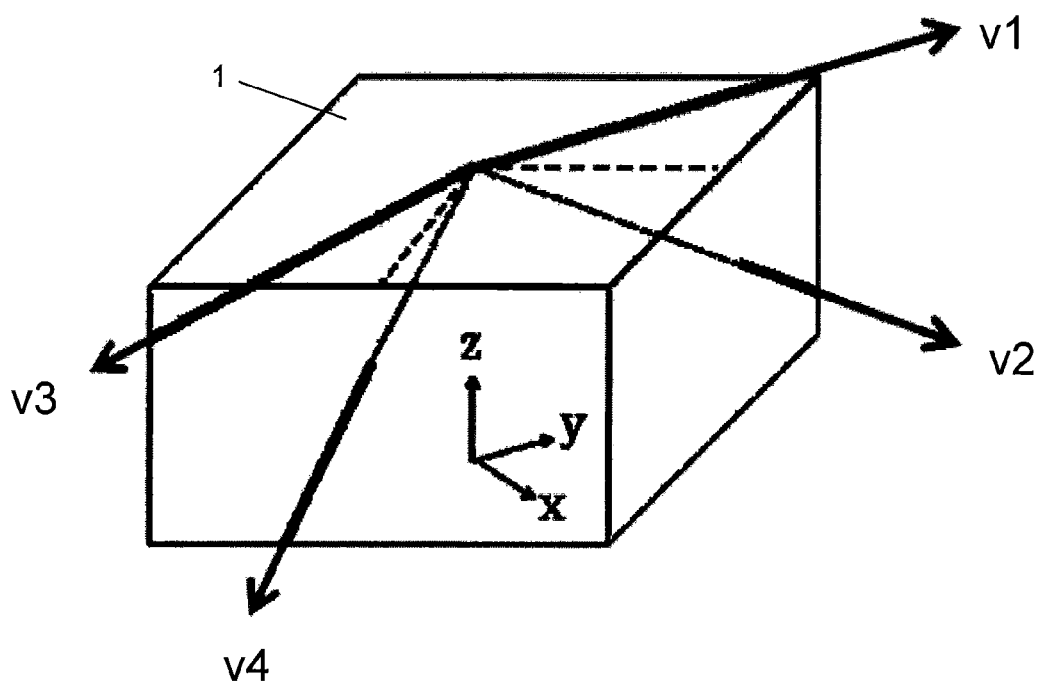
FIG. 5 schematically illustrates a scanning head which covers the four measuring directions according to an example embodiment of the present invention.

As a further exemplary embodiment, FIG. 5 illustrates a single scanning head 1 which combines the four sensitivity vectors v1, v2, v3 and v4, already described above, in a single scanning head having a total of four measuring axes. A scanning head 1 which has four integrated measuring axes is likewise described in German Patent Application No. 10 2013 220 184.2 and U.S. patent application Ser. No. 14/508,097, each of which is expressly incorporated herein in its entirety by reference thereto.

Sensitivity vectors v1, v2, v3, v4 may in each case be used in a variant rotated by 90°, 180°, or 270° in the X-Y plane. Also, a sign change in common for all sensitivity vectors changes nothing with respect to the functional principle described herein. These modifications are only expression of a rotated or inverted coordinate system within one corner, and not genuine alterations in the selection of the direction of sensitivity vectors v1, v2, v3, v4.

Figure 6:
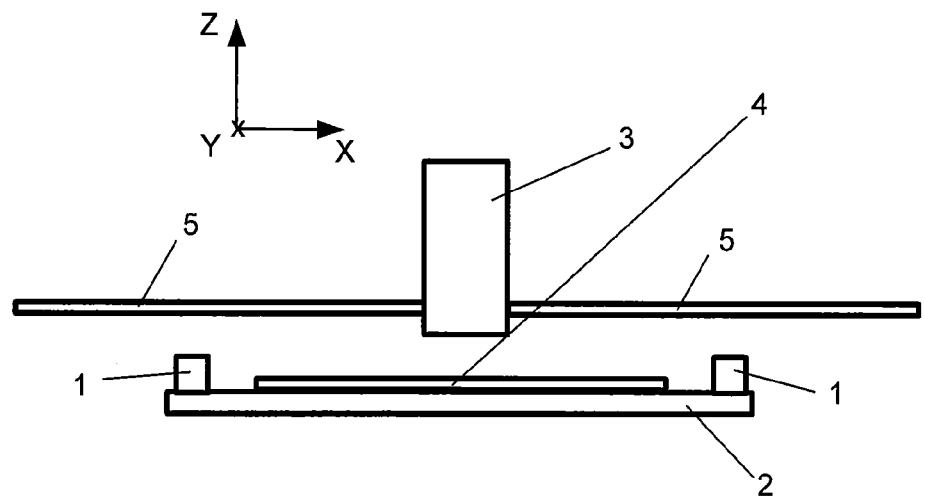
FIG. 6 is a side view of a system for positioning a tool relative to a workpiece.

FIG. 6 illustrates a table 2, in whose corners, in each case a scanning head 1 according to the first or third exemplary embodiment is disposed, so that here, 3-D position detection may be carried out in each corner of the table. Provided on table 2 is a workpiece 4 in the form of a wafer that is exposed to light with the aid of tool 3 (a lens). Scanning heads 1 scan measuring standards 5, which are joined fixedly to tool 3. In this manner, the position of workpiece 4 relative to the tool is ascertained and adjusted.

In summary, due to the alignment of the sensitivity vectors, the system described herein for positioning a tool relative to a workpiece makes it possible to measure position in one corner of a table, movable relative to a tool, in three directions that are independent of each other (referred to as 3-D position detection), so that in response to a movement in the main moving directions of the respective processing machine, compensatable periodic signals are always obtained. Besides the exposure machines mentioned, other applications having high demands on positioning accuracy, such as microscopes, electron beam lithography systems, laser writers, etc., for example, may be used.

What is claimed is:

1. A system for positioning a tool relative to a workpiece, comprising:
   a movable table adapted to accommodate a workpiece and to execute movements in first and second main moving directions during processing of the workpiece;
   at least one planar measuring standard arranged stationary about the tool and extending in a plane of the main moving directions; and
   scanning heads, mounted in at least three corners of the table, adapted to detect a position of the table relative to the measuring standards, in six degrees of freedom, in at least one of the corners, at least one scanning head having a total of at least three measuring axes being provided for 3-D position detection in three independent spatial directions;
   wherein sensitivity vectors of the measuring axes for the 3-D position detection are arranged neither parallel to a first plane defined by the first main moving direction and a direction orthogonal to the first and second main moving directions nor parallel to a second plane defined by the second main moving direction and the direction orthogonal to the first and second main moving directions.

2. The system according to claim 1, wherein the sensitivity vectors of the measuring axes for the 3-D position detection form an angle of at least 1° with the first and second planes, respectively.

3. The system according to claim 1, wherein a first and second sensitivity vector of a first and second measuring axis for the 3-D position detection are arranged in mirror symmetry relative to a third plane defined by the first and second main moving directions.

4. The system according to claim 3, wherein projections of the first and second sensitivity vectors, in mirror symmetry to the third plane, onto the third plane supply two identical vectors rotated by 45, 135, 225 or 315 degrees relative to the first main moving direction in the third plane.

5. The system according to claim 3, wherein a third sensitivity vector of a third measuring axis is arranged in the third plane and is linearly independent of the first and second sensitivity vectors.

6. The system according to claim 5, wherein the third sensitivity vector is perpendicular to the first and second sensitivity vectors.

7. The system according to claim 3, wherein for 3-D position detection, a third and fourth measuring axis are provided having a third and fourth sensitivity vector, which in each case is obtained by a rotation of the first and second sensitivity vector of 90 degrees about the direction orthogonal to the first and second main moving directions.

8. The system according to claim 7, wherein the first and second measuring axes are integrated in a first scanning head and the third and fourth measuring axes are integrated in a second scanning head.

9. The system according to claim 1, wherein all measuring axes for the 3-D position detection are integrated in a single scanning head.

10. The system according to claim 1, wherein measuring axes for 3-D position detection are present in at least three corners of the table.

* * * * *